(12) United States Patent
Hower et al.

(10) Patent No.: US 8,461,589 B1
(45) Date of Patent: Jun. 11, 2013

(54) CIRCUIT HAVING INTEGRATED HEATING STRUCTURE FOR PARAMETRIC TRIMMING

(75) Inventors: Philip L. Hower, Concord, MA (US); Barry Jon Male, West Granby, CT (US); Wilburn M. Miller, Manchester, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/489,257

(22) Filed: Jun. 5, 2012

(51) Int. Cl.
  *H01L 23/36* (2006.01)
  *H01L 23/58* (2006.01)
  *H01L 23/34* (2006.01)

(52) U.S. Cl.
  CPC ..................................... *H01L 23/345* (2013.01)
  USPC ....................... 257/48; 257/528; 257/E23.081

(58) Field of Classification Search
  CPC ...................................................... H01L 23/345
  USPC ..................................... 257/48, 528, E23.081
  See application file for complete search history.

(56) References Cited

U.S. PATENT DOCUMENTS

| | | | |
|---|---|---|---|
| 6,931,328 B2 * | 8/2005 | Braig et al. | 702/23 |
| 7,855,432 B2 | 12/2010 | Male | |
| 2010/0073122 A1 | 3/2010 | Le Neel et al. | |

* cited by examiner

*Primary Examiner* — Evan Pert
(74) *Attorney, Agent, or Firm* — Jacqueline J. Garner; Wade J. Brady, III; Frederick J. Telecky, Jr.

(57) ABSTRACT

An integrated circuit (IC) includes a heated portion. The heated portion/IC includes a substrate having a topside semiconductor surface having circuitry configured to provide a circuit function. A pre-metal dielectric (PMD) layer is on the topside semiconductor surface. A metal interconnect stack is on the PMD. A trim portion includes one or more temperature sensitive circuit components which affect a temperature behavior of the IC. The heated portion extends over and beyond an area of the trim portion having an integrated heating structure including at least a first heater formed from a metal interconnect level that includes a first plurality of winding segments which have a varying pitch. A heat spreader formed from a second metal interconnect layer is between trim portion and the first heater. Thermal plugs are lateral to the temperature sensitive circuit components and thermally couple the heat spreader to the topside semiconductor surface.

20 Claims, 8 Drawing Sheets

CIRCUIT HAVING INTEGRATED HEATING STRUCTURE FOR PARAMETRIC TRIMMING

FIELD

Disclosed embodiments relate to the field of integrated circuits having integrated heaters for parametric trimming.

BACKGROUND

Multi-temperature trimming of an integrated circuit (IC) device at wafer test, final test, or in the field application can be achieved by using an integrated (on-chip) heater to introduce a temperature rise over a specific area of the substrate (e.g., silicon). For example, one IC device that may be trimmed comprises a precision analog device, such as voltage reference or analog to digital converter (ADC), which comprises both passive devices (resistors, capacitors) and active devices (e.g., transistors) configured to provide the desired circuit function.

However, with known multi-temperature parametric trimming methods, the temperature both across the heated region above the substrate (e.g., thin film resistors or polysilicon resistors within a dielectric) and in the heated region within the substrate (e.g., transistors or diffused resistors on silicon) below can both have a significantly non-uniform temperature distribution. Moreover, there can be a significant temperature differential between the heated region above the substrate where the thin film resistors or polysilicon resistors reside and in the substrate where active devices (e.g., transistors) and passive devices (e.g., diffused resistors) reside. When trimming the IC device to minimize its temperature dependence, non-uniform temperature distributions introduce trimming errors, preventing the IC from being trimmed to a more optimal operating point, thus limiting the obtainable level of precision of the IC device.

SUMMARY

Disclosed embodiments include integrated circuits (ICs) having an integrated heating structure including at least one heater, a heat spreader, and thermal heat plugs which thermally couple the heat spreader to the topside semiconductor surface (e.g., silicon) of the substrate. The heating structure is over a portion of the IC referred to herein as the "heated portion". The heater(s) include a varying feature (e.g., segment) pitch. The varying pitch provides a non-uniform-surface power profile, which provides a more uniform temperature profile in the heated portion of the IC during heated parametric trimming operations.

One or more temperature sensitive circuit components which affect the temperature behavior of the IC are in a trim portion. The area of the heater and heat spreader of the heated portion extends over and beyond the area of the trim portion. The integrated heating structure can be used to heat the temperature sensitive circuit components in the trim portion during parametric trimming, where the temperature sensitive circuit components may include precision analog components that comprise both passive and active devices.

Disclosed ICs provide a more uniform temperature profile across the heated portion above the substrate, in the heated portion within the substrate below, and between the heated portion above the substrate and the heater. Such ICs reduce trimming errors, allowing disclosed ICs to be trimmed to a more optimal operating point, thus improving the obtainable level of precision of disclosed IC devices. Multi-temperature trimming can also now be performed with a more uniform temperature rise that more closely matches an externally induced temperature rise, providing a better environment for low-cost trimming for improved temperature performance of disclosed ICs.

One disclosed embodiment comprises an IC including a substrate having a topside semiconductor surface with active circuitry and passive circuitry configured to provide a circuit function, such as a voltage reference, for example. A pre-metal dielectric (PMD) layer is on the topside semiconductor surface. A metal interconnect stack is on the PMD layer including metal interconnect levels having inter-level dielectric layers (ILDs) therebetween. A trim portion includes one or more temperature sensitive circuit components which affect the temperature behavior of the IC. The heated portion extends over and beyond an area containing the trim portion having an integrated heating structure including at least a first heater formed from a metal interconnect level that includes a first plurality of winding segments which have a varying pitch. A heat spreader formed from a second metal interconnect layer is between the trim portion and the first heater. Thermal plugs are lateral to the temperature sensitive circuit components which thermally couple the heat spreader to the topside semiconductor surface.

An operating point of the IC can be permanently programmed (changed) to significantly reduce parametric temperature drift by application of heat provided by a disclosed heating structure when biased. More uniform heating provided by disclosed integrated heating structures is applicable to any component in the trim portion residing in the IMD or in the substrate region below the heater. The components in the IDM can be one or more of resistors of film (e.g., polysilicon, SiCr, NiCr) or metal (e.g., aluminum or copper), as well as capacitors (which can be metal or metal-TiN types), or inductors. The components in the substrate can include all varieties of resistor, silicon controlled rectifiers (SCRs), bipolars, metal-oxide-semiconductor field-effect transistors (MOSFETs), varactors, opto-electronic devices, and hall devices, for example.

BRIEF DESCRIPTION OF THE DRAWINGS

Reference will now be made to the accompanying drawings, which are not necessarily drawn to scale, wherein.

DETAILED DESCRIPTION

Figure 1A:
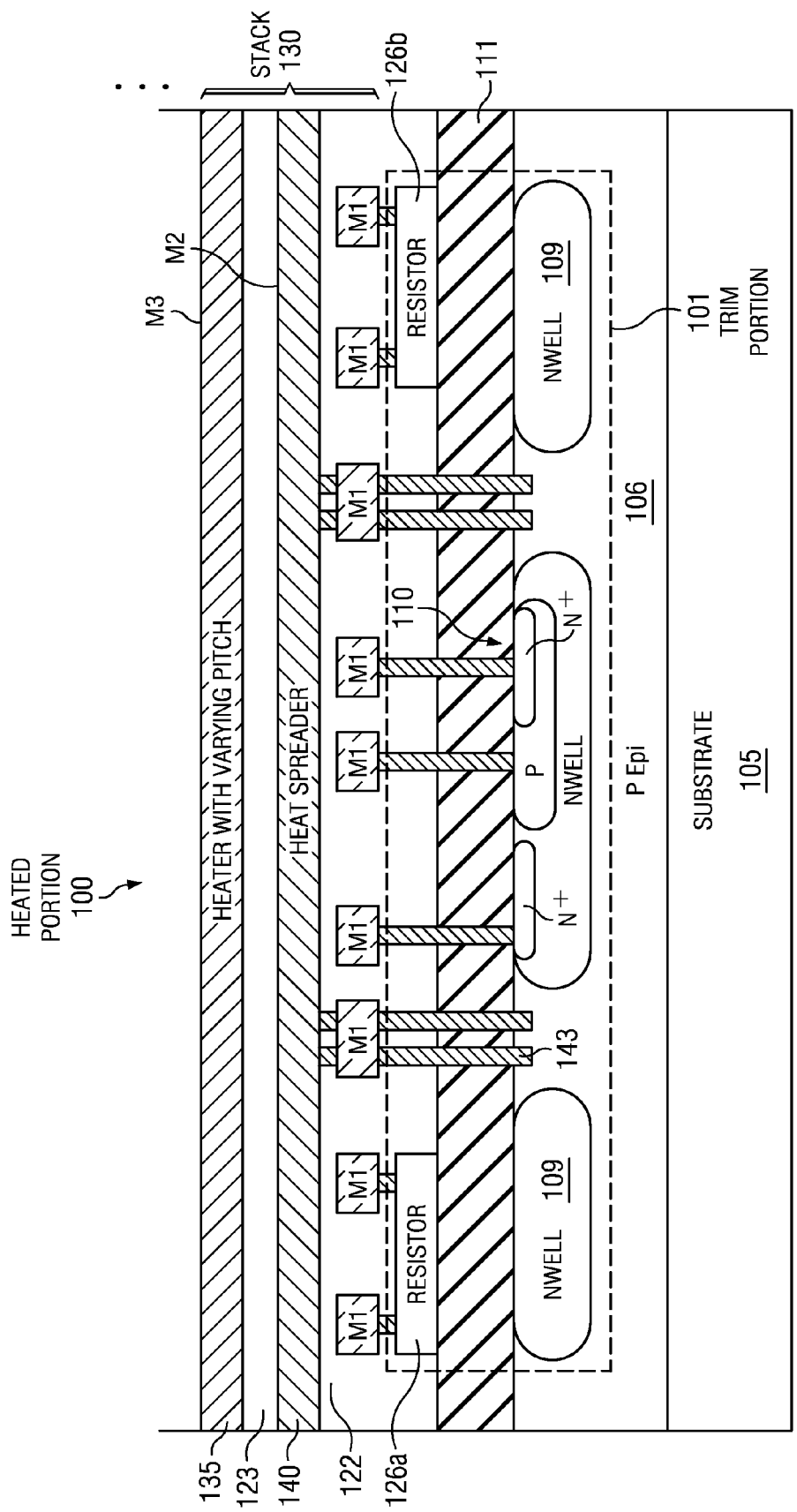
FIG. 1A is a cross-sectional depiction of a portion of an IC ("heated portion") including an example integrated heating structure for heating active and passive circuit components in a trim portion within the heated portion during parametric trimming, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a cross-sectional depiction of a portion of an IC referred to as a heated portion 100 which includes an example integrated heating structure for heating active and passive circuit trim components in a trim portion 101 that is within the heated portion 100 during parametric trimming, according to an example embodiment. The trim portion 101 includes temperature sensitive circuit components. Heated portion 100 includes a substrate 105 having a topside semiconductor surface 106 shown as a p-epi layer including circuitry configured to provide a circuit function shown as simply an npn bipolar transistor 110 which can be any active device and passive circuitry shown as semiconductor (nwell) resistors 109. A PMD layer 111 is on the topside semiconductor surface 106. The substrate 105 can comprise silicon, silicon-germanium, or another substrate that provides a topside semiconductor surface 106. Although no isolation structure is shown, disclosed ICs can include junction isolation or dielectric isolation.

A metal interconnect stack 130 is on the PMD layer 111 and comprises a plurality of metal interconnect levels shown as metal 1 (M1), metal 2 (M2) and metal 3 (M3) having interlevel dielectric (ILD) layers therebetween. The ... shown in FIG. 1A indicates the possible presence of additional metal interconnect levels. ILD 122 is between M1 and M2, and ILD 123 is between M2 and M3. Disclosed ICs can have as few as 2 metal interconnect levels, or up to 7, 8, or more metal interconnect levels. In a 2 metal level embodiment, a heater and a heat spreader can be placed over IMD resistors, such as polysilicon resistors, where the metallic connections to the ends of the resistors are made outside of the heated portion.

Trim portion 101 includes at least one temperature sensitive circuit component configured for trimming shown as trim resistors 126a and 126b positioned above the PMD layer 111 and connected as part of the IC. The trim resistors 126a and 126b comprise the circuitry that can be controlled to permanently alter the electrical resistance during the application of heat generated by disclosed heaters when biased, such as the first heater 135 described below. The materials for trim resistors 126a, 126b can comprise doped polysilicon or other thin film resistor materials, such as metal, for example, high-sheet resistance metal-silicon layers, for example, silicon plus chromium (SiCr). In addition, the temperature sensitive circuit component for trimming can reside in the IMD and include capacitors which can be metal to metal capacitors as well as M1-TiN capacitors. Heated portion 100 generally also includes resistors formed in the topside semiconductor surface 106, such as n+ or p+ diffused resistors, shown as nwell resistors 109 in FIG. 1A.

At least a first heater 135 is formed from a first of the metal interconnect levels shown in FIG. 1A as M3. The first heater 135 comprises a first plurality of winding segments which have a varying pitch (see FIG. 2A for an example first heater layout that shows varying the metal pitch of the segments) which extend over, and fully enclose (i.e. extend over) the trim resistors 126a and 126b, active circuitry including the npn bipolar transistor 110, and nwell resistors 109 as shown in FIG. 1A to allow more uniform heating of these circuit elements which are part of temperature sensitive circuitry. In one particular embodiment the first heater 135 comprises a circular (concentric element) structure.

Heated portion 100 also includes a heat spreader 140 formed from a second of the plurality of metal interconnect layers shown as formed from M2 positioned between the trim resistors 126a, 126b and the first heater 135. Heat spreader 140 generally comprises a single metal sheet (or plate). Heated portion 100 also includes a plurality of thermal plugs 143 lateral to the trim resistors 126a, 126b which provide thermal coupling between the heat spreader 140 and the topside semiconductor surface 106.

The inclusion of heat spreader 140 coupled to thermal plugs 143 provides efficient heat transfer to the topside semiconductor surface 106 reducing overall thermal time-constants during heating. Some thermal plugs 143 can be seen to provide direct thermal contact between the heat spreader 140 and the topside semiconductor surface 106. Thermal plugs 143 can comprise vias in the PMD layer 111 filled with metal. In one embodiment, the thermal plugs 143 comprise tungsten filled vias.

In one embodiment the heat spreader 140 is both thermally and electrically connected via the thermal plugs 143 to the substrate by connection to the topside semiconductor surface 106. Connection to the substrate will typically cause the Faraday shield to assume a ground potential, but in other embodiments the thermal plugs may be connected to other substrate regions so other (non-zero) Faraday shield voltages may be realized. For thermal coupling reasons, thermal plugs 143 can provide a continuous encirclement for the passive and active component that resides in the trim portion 101.

The first heater 135 is electrically floating. During heating operations, however, first heater 135 will be connected to a power source, via a switch. The heat spreader 140 and thermal plugs 143 can be floating, but also can be connected to a circuit ground. When the heat spreader 140 and thermal plugs 143 are configured in a Faraday shield arrangement, connecting the heat spreader 140 and thermal plugs 143 to the circuit ground allows enclosure of the temperature sensitive circuit components in the trim portion 101 in a grounded Faraday shield. Shielding eliminates undesirable capacitive coupling from the first heater 135 or heater(s), which will have a switched voltage, to the temperature sensitive circuit components in trim portion 101 during trimming.

Although not shown, as noted above, the IC associated with heated portion 100 can include a switch structure to allow switchably coupling a power source to turn the first heater 135 on and off when desired to control heating of the heated portion 100. The switch structure can be on the same die as the IC, or external to IC.

Figure 1B:
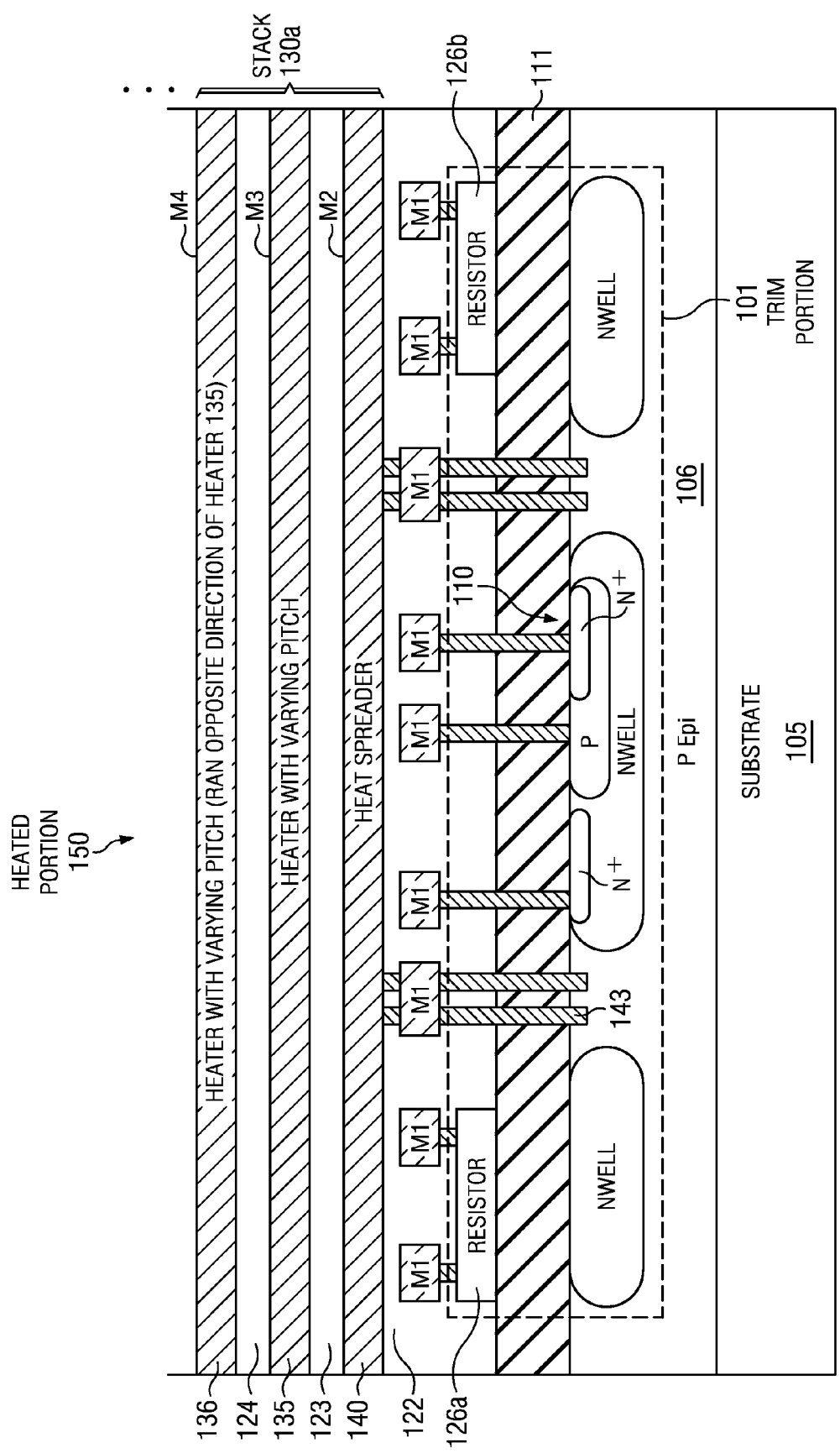
FIG. 1B is a cross-sectional depiction of another heated portion of an IC including an example integrated heating structure having first and second heaters for heating active and passive circuit components in a trim portion within the heated portion during parametric trimming, according to an example embodiment.

FIG. 1B is a cross-sectional depiction of a heated portion 150 of an IC including an integrated heating structure comprising a first heater 135 and a second heater 136 for heating active and passive circuit components in a trim portion within the heated portion during parametric trimming, according to an example embodiment. Heated portion 150 has a metal interconnect stack 130a on the PMD layer 111 and comprises a plurality of metal interconnect levels shown as metal 1 (M1), metal 2 (M2), metal 3 (M3) and metal 4 (M4), having ILD layers therebetween shown as ILD 122 between M1 and M2 and ILD 123 between M2 and M3 and ILD 124 between M3 and M4. First heater 135 is shown formed from M3 and second heater 136 is shown formed from M4. See FIG. 2B for an example second heater layout that shows varying the metal pitch of the heater segments.

Figure 2A:
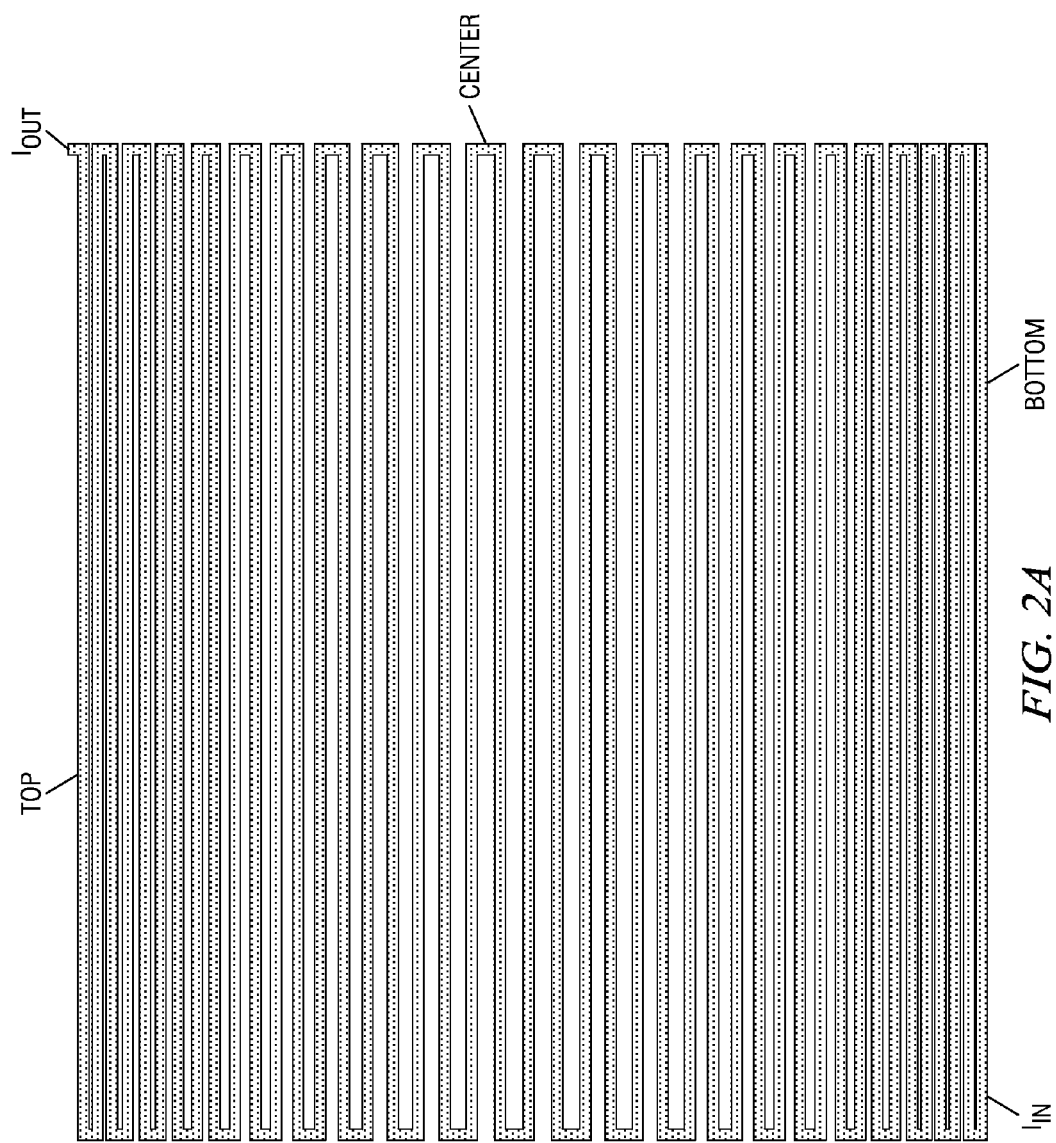
FIG. 2A shows an example metal pattern having a plurality of winding segments with varying segment pitch that can be used for the first heater shown in FIG. 1A, according to an example embodiment.

FIG. 2A shows an example heater 200 having an example metal pattern including a plurality of winding segments with varying segment pitch which can be used for the first heater 135 shown in FIG. 1A, according to an example embodiment. $I_{IN}$ and $I_{OUT}$ represent the locations current is forced into heater 200 and out from heater 200, respectively, when biased during heated trimming operations. The pitch (center-to-center spacing) between adjacent horizontally oriented segments can be seen to be at a minimum at the top and bottom of heater 200, a maximum at the center of heater 200, with the segment pitch linearly decreasing from the center to both the top and the bottom of heater 200. The maximum segment spacing can be seen to be at least two (2) times the minimum segment spacing.

Disclosed segment pitch variations can be other than linearly variations. The pitch variation is generally a decreasing function of distance from the heater edge. A linear function has been found to work well and its slope is easily determined. More complicated functions can also be used, for example a parabola, or an exponential. The optimum values of the coefficients for these functions could be determined analytically or numerically. The optimum values would be those that minimize the variation of temperature over the distance from heater edge to heater center. An arbitrary function is also possible and its form can be determined by the method of calculus of variations.

Figure 2B:
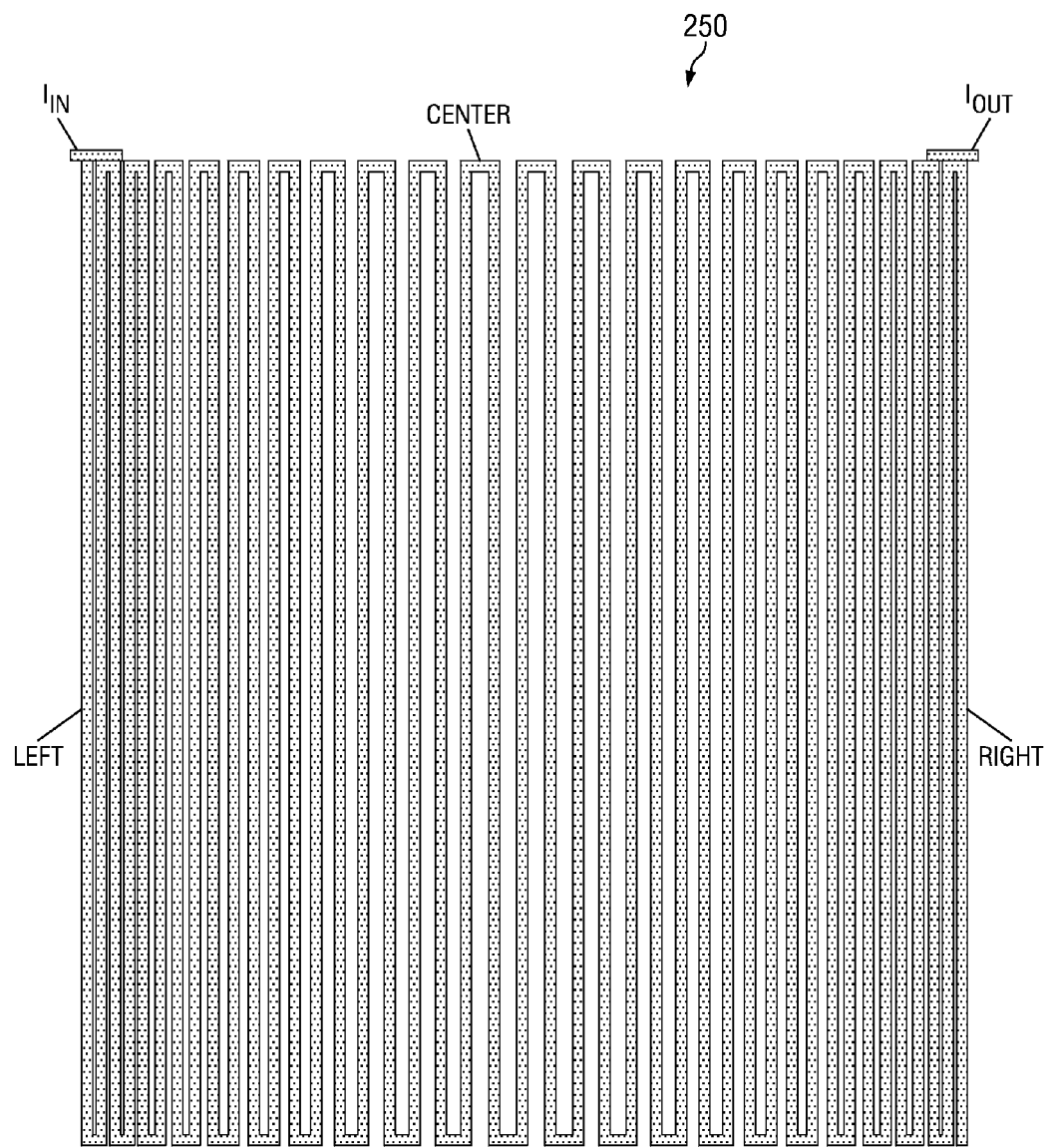
FIG. 2B shows an example metal pattern having a plurality of winding segments with varying segment pitch that can be used for the second heater shown in FIG. 1B according to an example embodiment.

FIG. 2B shows an example heater 250 having an example metal pattern including a plurality of winding segments with varying pitch which can be used for the second heater 136 shown in FIG. 1B, according to an example embodiment. The pitch (center-to-center spacing) between adjacent vertically oriented segments can be seen to at a minimum at the left and right of heater 250, a maximum at the center of heater 250, with the segment pitch linearly decreasing from the center to both the left and right of heater 250. As with heater 200, disclosed segment pitch variations can be other than linearly variations.

The stacking of heater 200 and heater 250 can be seen to provide orthogonal heaters. As defined herein the orthogonal condition is where the segments in the respective heaters are oriented 90°±10° relative to each other (80 to 100 degrees). The orthogonal condition has been found to provide the best heating uniformity in the case of two stacked heaters 200 and 250. Other embodiments include 3 stacked heaters at about 60 degree increments relative to one another and 4 stacked heaters at about 45 degree increments relative to one another. Stated generally, the plurality (N) of stacked heaters can be angled at 180°/N±10° relative to one another.

Figure 3:
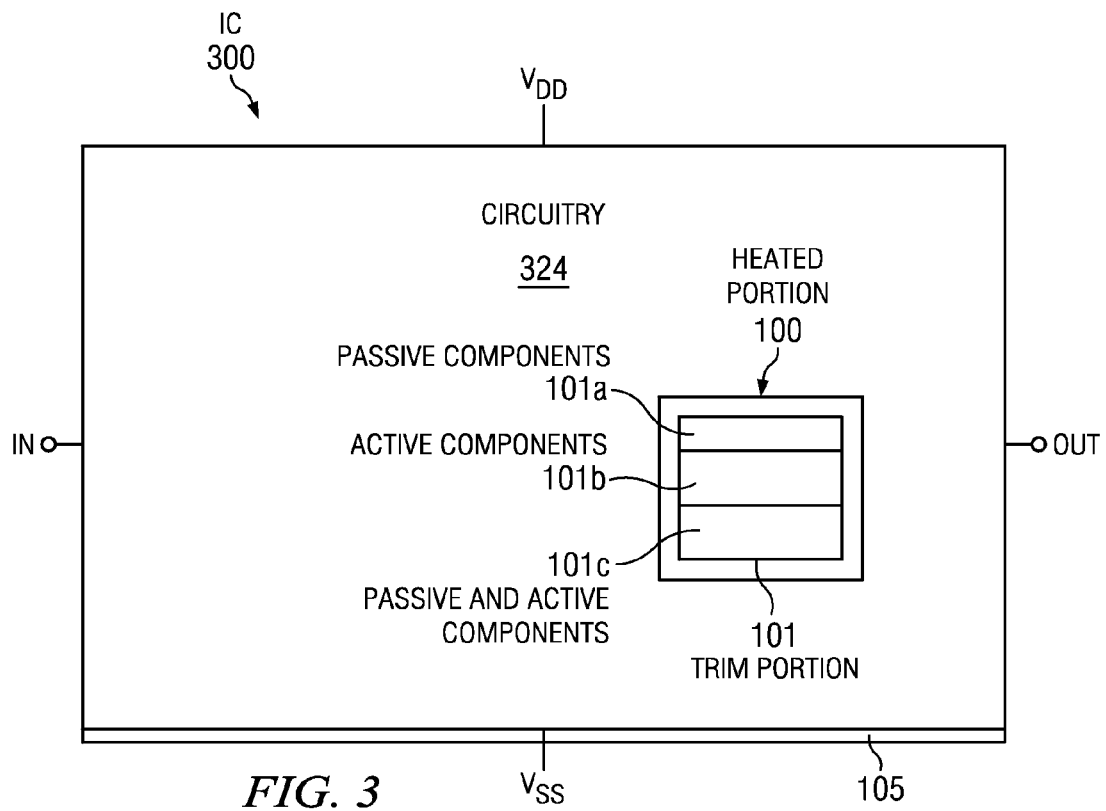
FIG. 3 is a top view depiction of an IC having a heated portion including an example integrated heating structure for heating active and passive circuit components in a trim portion within the heated portion during parametric trimming, according to an example embodiment.

FIG. 3 illustrates a high level depiction of a construction of an IC 300 into which one or more disclosed integrated heating structures may be incorporated to heat portions of the IC such as heated portion 100 shown in FIG. 1A that include a trim portion 101 therein having temperature sensitive circuit components, according to an example embodiment. Trim portion 101 is shown including a passive components sub-portion 101a, an active components sub-portion 101b, and passive and an active components sub-portion 101c.

For example, IC 300 can comprise a precision analog device (e.g., a voltage reference or analog to digital converter). IC 300 includes circuitry 324 configured to provide a circuit function, which realizes and carries out desired functionality of IC 300, such as that of an analog IC. The capability of circuitry 324 provided by IC 300 may vary, for example ranging from a simple device to a complex device. The specific functionality contained within circuitry 324 is not of importance to disclosed embodiments.

Figure 4:
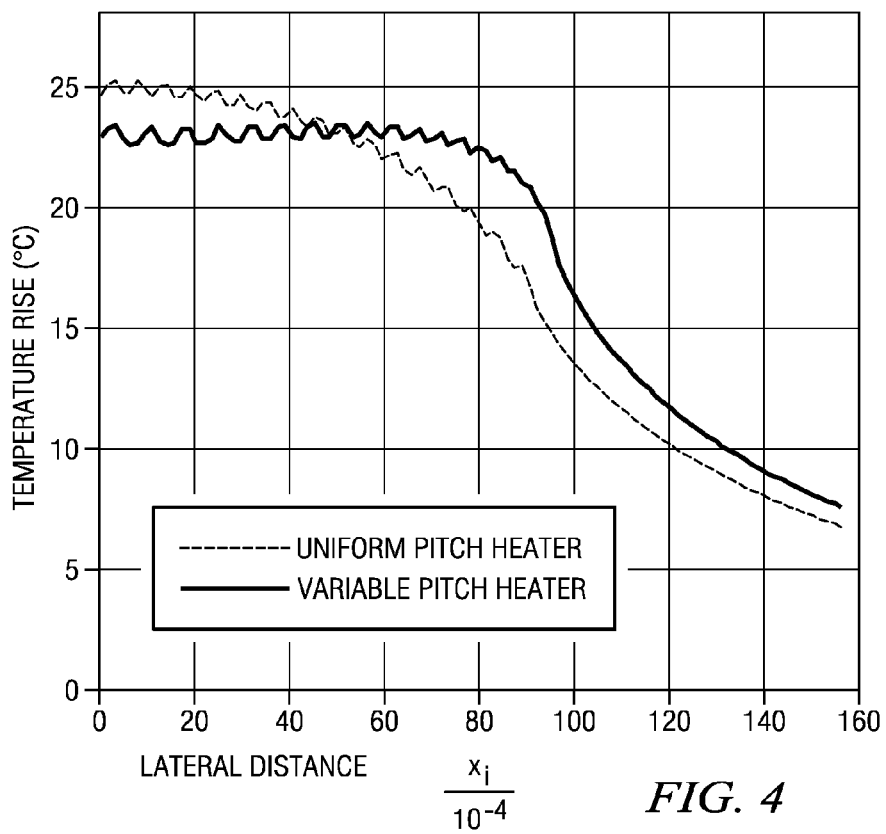
FIG. 4 provides simulation results showing the thermal temperature rise vs. lateral distance (in μm) from the center of the heater for a disclosed variable pitch heater and a uniform pitch heater, that demonstrates that disclosed variable pitch heaters improved lateral temperature uniformity.

FIG. 4 provides temperature rise on the vertical axis in ° C. vs. lateral distance in μm from the center of the heater for a disclosed single variable pitch heater and a single uniform pitch heater, both 212 ohms, that demonstrates disclosed variable pitch heaters improve lateral temperature uniformity. The temperature rise is based on a calculated Rth (° C./W) and 1 Watt of applied power to the 212 ohm heater.

Figure 5:
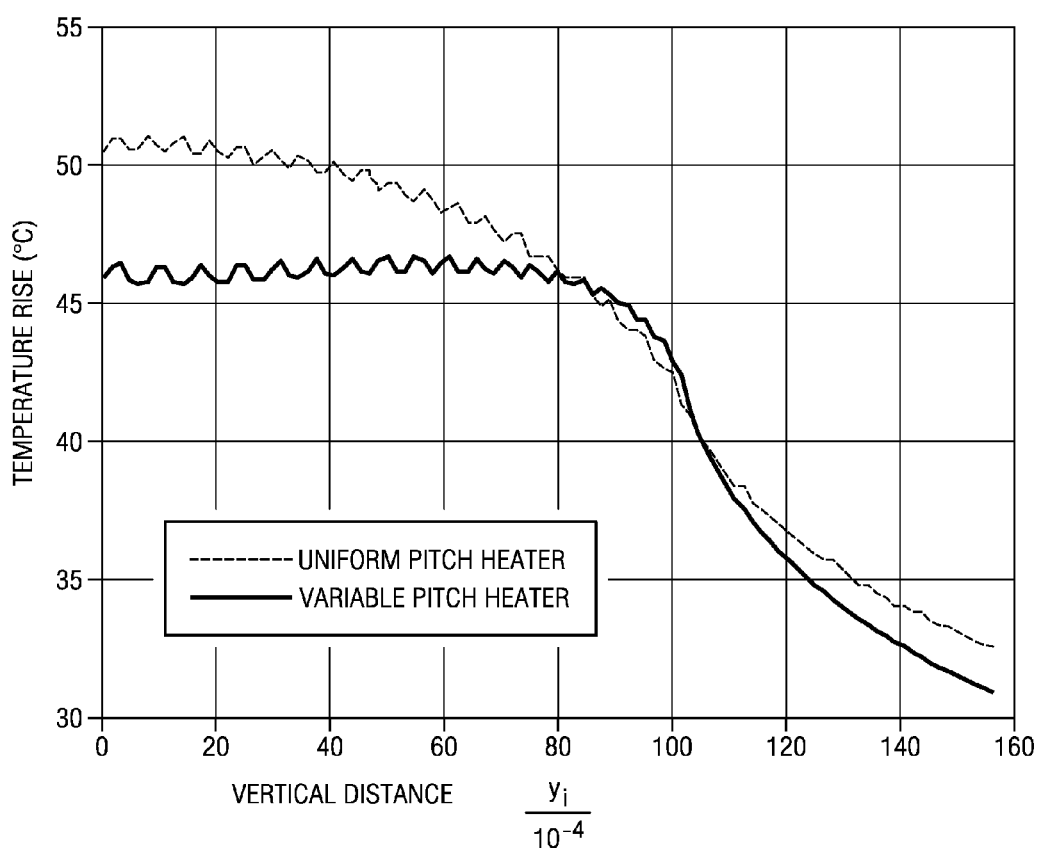
FIG. 5 provides simulation results showing the temperature rise vs. vertical distance (in μm) from the center of the heater for a disclosed first and second variable pitch heater oriented orthogonal to one another and a first and second uniform pitch heater, that demonstrates disclosed variable pitch heaters improve vertical temperature uniformity.

FIG. 5 provides temperature rise on the vertical axis in ° C. vs. vertical distance in μm from the center of the heater for a disclosed first and second variable pitch heater oriented orthogonal to one another and a first and second uniform pitch heater, with each heater being 212 ohms, that demonstrates disclosed variable pitch heaters improves vertical temperature uniformity. The temperature rise is based on 1 Watt of applied power to the 212 ohm heaters. In general, the heater size (area) should be large enough to cover the trim portion that is to achieve the temperature rise. The temperature rise should be large enough so that it is easily distinguishable against the thermal noise background. The temperature rise and heater size determine the required power. The heater resistance can be adjusted to be compatible with the required power, circuit voltage levels, and available control elements.

Figure 6:
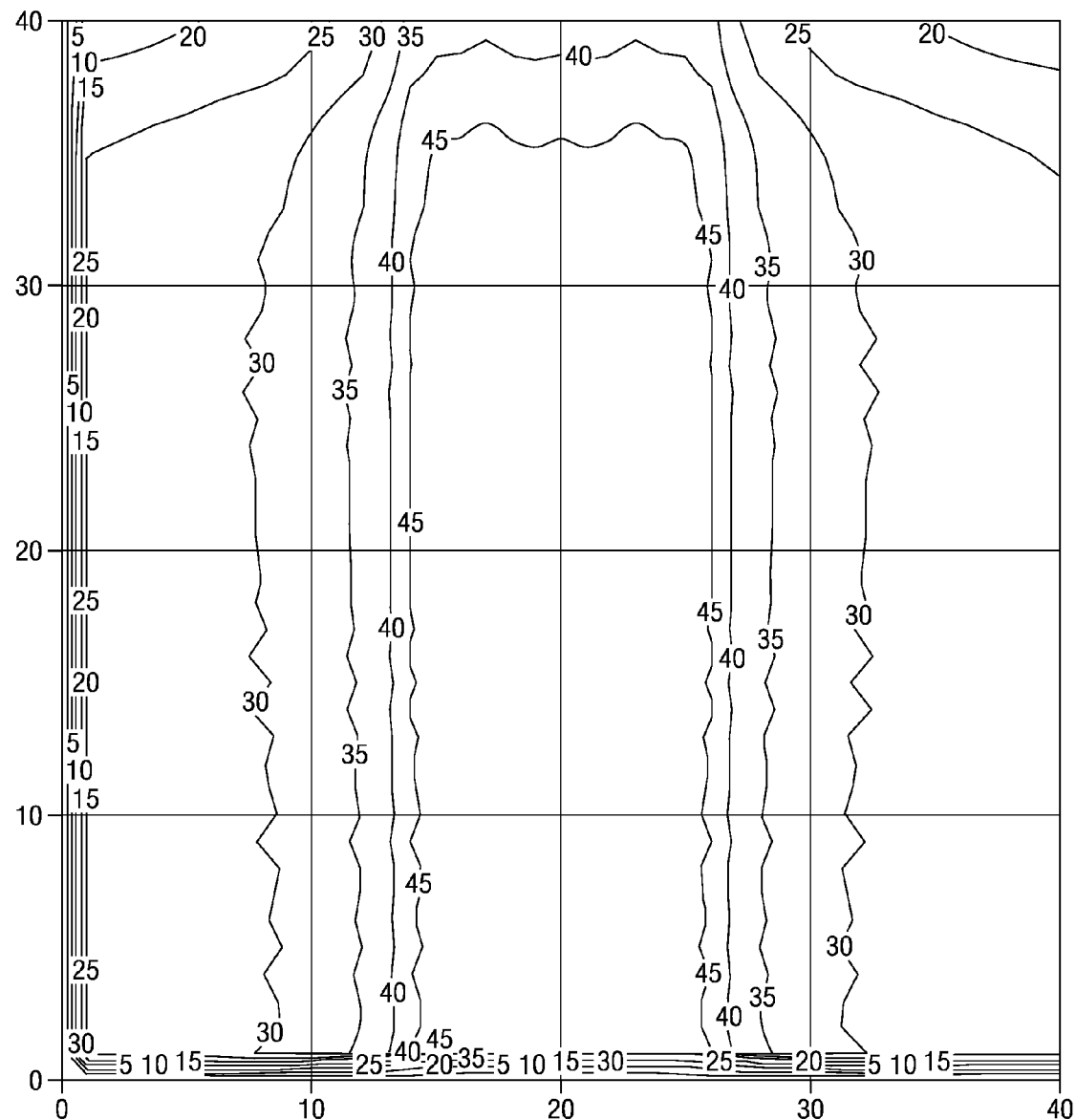
FIG. 6 is a temperature contour map from simulation showing the temperature rise provided by disclosed first and second variable pitch heaters oriented orthogonal to one another, where the x and y axes are normalized distances.
Figure 7:
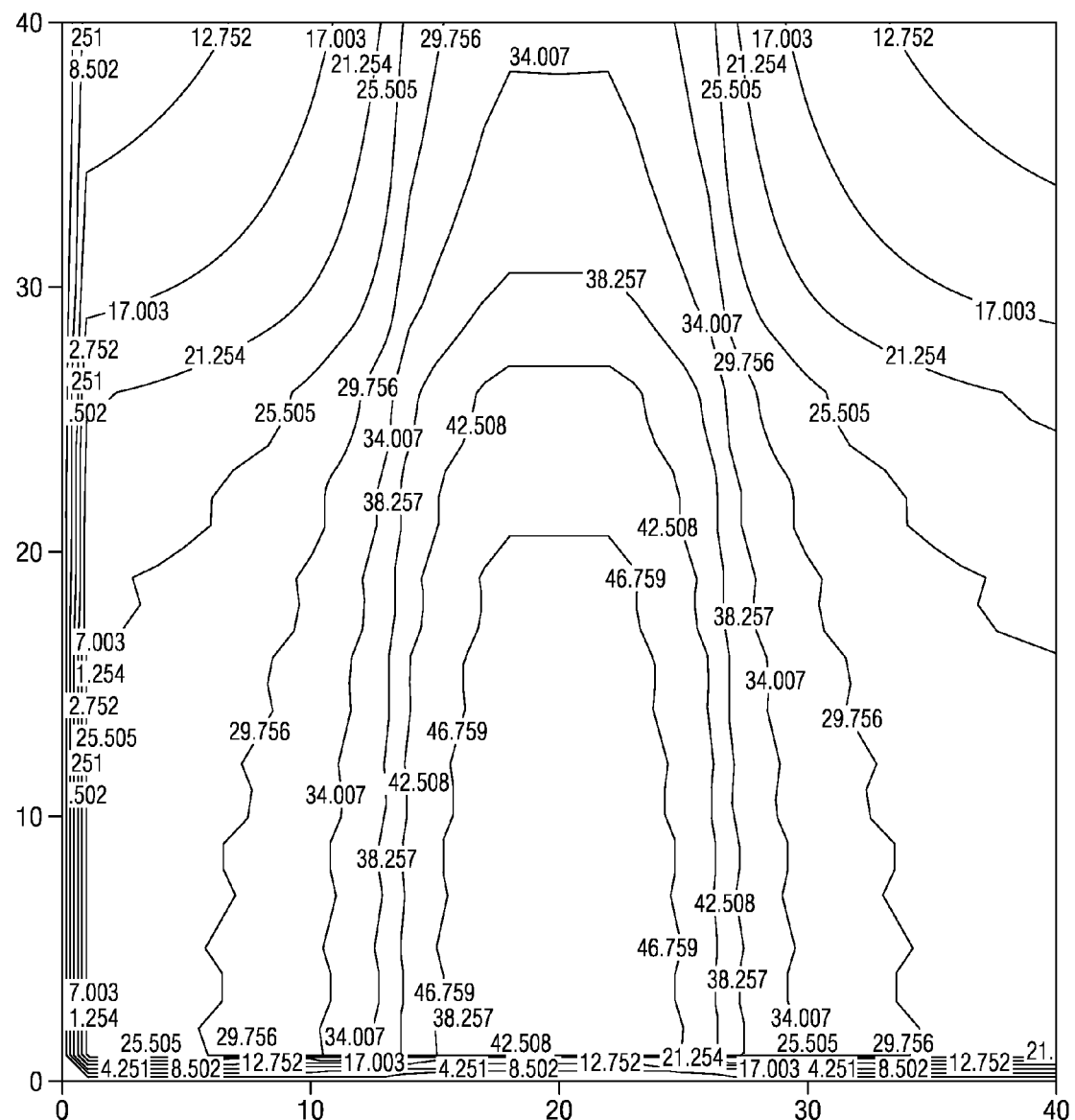
FIG. 7 is a temperature contour map from simulation showing the temperature rise provided by first and second fixed pitch heaters, where the x and y axes are normalized distances. A comparison of the data in FIG. 6 to that of FIG. 7 evidences disclosed first and second variable pitch heaters provide a significant improvement in temperature uniformity over first and second fixed pitch heaters, where the axes are distance.

FIGS. 6 and 7 are contour maps of temperature rise. A normalization factor was applied to the x and y axes by software. The contour lines are lines of constant temperature rise. The curves are traced out as x and y are varied and the temperature rise is held constant. The vertical and horizontal axes in both FIGS. 6 and 7 represents distance. For example, the vertical axis in FIGS. 6 and 7 is the same as the horizontal axis in FIG. 5, where the temperature is plotted vs. vertical distance.

FIG. 6 is a contour map of temperature rise provided by disclosed first and second variable pitch heaters oriented orthogonal to one another. FIG. 7 is a contour map of temperature rise provided by first and second fixed pitch heaters oriented orthogonal to one another. A comparison of the contour data in FIG. 6 to that of FIG. 7 evidences disclosed first and second variable pitch heaters provide a significant improvement in temperature uniformity as compared to first and second fixed pitch heaters by providing a smaller temperature variation.

As described above, disclosed embodiments vary the pitch of the metal segments of the heaters, across the trim portions of the IC containing the temperature sensitive circuit components. Addition of disclosed heat spreaders and thermal plugs augment uniform heating of the trim area by the heaters and reduce the overall thermal time-constants which allow more uniform heating of temperature sensitive circuit components, such as resistor components in the ILD (thin film resistors/polysilicon resistors) and those in the topside semiconductor surface (e.g., silicon). No additional mask layers are required to implement disclosed integrated heating structures.

Disclosed integrated heating structures are expected to have a broad range of applications that can benefit from internally induced, rapid, and uniform temperature rises within an area of temperature sensitive circuitry, since they can replace known costly, multi-point production temperature trim with low-cost, room temperature production trim and meet the same parametric performance. For example, ICs requiring accurate, temperature stable, current, voltage or resistance can benefit from disclosed embodiments.

Disclosed embodiments can be integrated into a variety of assembly flows to form a variety of different semiconductor IC devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. An integrated circuit (IC), comprising:
   a substrate having a topside semiconductor surface having active circuitry and passive circuitry configured to provide a circuit function;
   a pre-metal dielectric (PMD) layer on said topside semiconductor surface;
   a metal interconnect stack on said PMD layer comprising a plurality of metal interconnect levels having interlevel dielectric layers (ILDs) therebetween;
   a trim portion including one or more temperature sensitive circuit components which affect a temperature behavior of said IC;
   a heated portion extending over and beyond an area of said trim portion having an integrated heating structure, said integrated heating structure including:
      at least a first heater formed from a first of said plurality of metal interconnect levels comprising a first plurality of winding segments which have a varying pitch;
      a heat spreader formed from a second of said plurality of metal interconnect layers between said trim portion and said first heater, and
      a plurality of thermal plugs lateral to said temperature sensitive circuit component thermally coupling said heat spreader to said topside semiconductor surface.

2. The IC of claim 1, wherein some of said plurality of thermal plugs provide direct thermal contact between said heat spreader sheet and said topside semiconductor surface.

3. The IC of claim 1, wherein said varying pitch provides a minimum segment spacing at outer edges of said first heater and a maximum segment spacing proximate to a center of said first heater, and wherein said varying pitch of said first plurality of winding segments increases in a linear fashion from said outer edges of said first heater to said center of said first heater.

4. The IC of claim 3, wherein said maximum segment spacing is at least two (2) times said minimum segment spacing.

5. The IC of claim 1, wherein said at least a first heater comprises a plurality (N) of heaters each utilizing a different one of said plurality of metal interconnect levels, and wherein said plurality (N) of said heaters are angled at $180°/N \pm 10°$ relative to one another.

6. The IC of claim 5, wherein each of said plurality (N) of said heaters comprise a plurality of winding segments that provide a varying pitch.

7. The IC of claim 1, wherein said at least a first heater consists of said first heater and a second heater formed from a third of said plurality of metal interconnect levels comprising a second plurality of winding segments.

8. The IC of claim 7, wherein said second plurality of winding segments are oriented $90° \pm 10°$ relative to said first plurality of winding segments.

9. The IC of claim 8, wherein said second plurality of winding segments provide a varying pitch.

10. The IC of claim 9, wherein said varying pitch of said second plurality of winding segments provides a minimum segment spacing at outer edges of said second heater, a maximum segment spacing proximate to a center of said second heater, and wherein said varying pitch of said second plurality of winding segments increases in a linear fashion from said outer edges of said second heater to said center of said second heater.

11. The IC of claim 10, wherein said maximum segment spacing is at least two (2) times said minimum segment spacing.

12. The IC of claim 1, wherein said temperature sensitive circuit component comprises at least one of a diffused resistor, thin film resistor, inductor and a capacitor.

13. The IC of claim 1, wherein said heat spreader consists of a single heat spreader plate.

14. The IC of claim 1, wherein said plurality of thermal plugs comprise tungsten.

15. The IC of claim 1, wherein said heat spreader and said plurality of thermal plugs are both connected to a ground for said IC.

16. An integrated circuit (IC), comprising:
   a substrate having a topside silicon surface having active circuitry and passive circuitry configured to provide a circuit function;
   a pre-metal dielectric layer (PMD) layer on said topside silicon surface;
   a metal interconnect stack on said PMD layer comprising a plurality of metal interconnect levels having interlevel dielectric layers (ILDs) therebetween;
   a trim portion including one or more temperature sensitive circuit components which affect a temperature behavior of said IC;
   a heated portion extending over and beyond an area of said trim portion having an integrated heating structure, said integrated heating structure including:
      a first heater formed from a first of said plurality of metal interconnect levels comprising a first plurality of winding segments which have a varying pitch and extend over said trim resistor;
      a second heater over said first heater formed from a second of said plurality of metal interconnect levels comprising a second plurality of winding segments which have a varying pitch, wherein said second plurality of winding segments are oriented eighty (80) degrees to one hundred (100) degrees relative to said first plurality of winding segments;

a heat spreader formed from a third of said plurality of metal interconnect layers between said trim portion and said first heater, and a plurality of thermal plugs lateral to said temperature sensitive circuit component coupling said heat spreader to said topside silicon surface.

17. The IC of claim 16, wherein some of said plurality of thermal plugs provide direct thermal contact between said heat spreader sheet and said topside silicon surface.

18. The IC of claim 16, wherein said temperature sensitive circuit component includes at least one resistor.

19. The IC of claim 16, wherein said heat spreader consists of a single heat spreader plate.

20. The IC of claim 16, wherein said varying pitch of said first plurality of winding segments and said second first plurality of winding segments both provide (i) a minimum segment spacing at their outer edges and a maximum segment spacing proximate to their centers, (ii) a pitch that increases in a linear fashion from said outer edges to said center, and (iii) said maximum segment spacing being at least two (2) times said minimum segment spacing.

* * * * *